United States Patent [19]
Koenig

[11] Patent Number: 5,559,448
[45] Date of Patent: Sep. 24, 1996

[54] CMOS TERMINATING RESISTOR CIRCUIT

[75] Inventor: Wilhelm Koenig, Stadtbergen, Germany

[73] Assignee: Siemens Aktiengesellschaft, Munich, Germany

[21] Appl. No.: 418,367

[22] Filed: Apr. 7, 1995

[30] Foreign Application Priority Data

Apr. 7, 1994 [DE] Germany ............ 44 12 055.9

[51] Int. Cl.$^6$ .................. H03K 17/16; H03K 19/094
[52] U.S. Cl. ........................ 326/30; 326/86; 333/22 R
[58] Field of Search ........................ 326/30, 31–32, 326/34, 21, 86; 375/257; 333/22 R, 32

[56] References Cited

U.S. PATENT DOCUMENTS

| | | | |
|---|---|---|---|
| 4,859,877 | 8/1989 | Cooperman et al. | 326/30 |
| 5,124,580 | 6/1992 | Matthews et al. | 326/32 |
| 5,254,883 | 10/1993 | Horowitz et al. | 326/30 |
| 5,283,479 | 2/1994 | Rosseel et al. | 326/21 |
| 5,329,184 | 7/1994 | Redfern | 326/66 |
| 5,396,028 | 3/1995 | Tomasseth | 178/69 R |
| 5,422,608 | 6/1995 | Levesque | 333/22 R |

FOREIGN PATENT DOCUMENTS 2248143  3/1992  United Kingdom .

OTHER PUBLICATIONS

Horenstein. "Microelectronic Circuits and Devices", Prentice Hall: New Jersey, 1990. pp. 302–309.
"Terminieren von Signalleitungen, Korrekte Abschlusse vermeiden Echos und Uberschwinger", Elektronik 22/1990, pp. 236–254.
Paul R. Gray, Robert G. Meyer, "Analysis and Design of Analog Integrated Circuits", John Wiley & Sons, New York, 1984, pp. 731–736.
IEEE Standard for Low–Voltage Differential Signals for SCI (LVDS), IEEE Standard P1596.3, Dec. 30, 1993.

Primary Examiner—Edward P. Westin
Assistant Examiner—Jon Santamauro
Attorney, Agent, or Firm—Hill, Steadman & Simpson

[57] ABSTRACT

An improved CMOS termination is disclosed wherein a transmission gate provides the proper impedance for matching a termination with the characteristic impedance of the line.

11 Claims, 4 Drawing Sheets

CM OS TERMINATING RESISTOR CIRCUIT

BACKGROUND OF THE INVENTION

1. Field of the Invention

The present invention relates generally to the field of line terminating devices, and, more particularly, the present invention relates to an improved CMOS line termination circuit.

2. Description of the Related Art

In communication systems and computers, lines having a defined characteristic impedance must be used for transmission of data at extremely high rates and the end of the line must be terminated with a resistor that corresponds to the characteristic impedance of the line. Failure to provide such a termination results in reflections and line disturbances that interfere with the desired signal and result in data errors.

Data rates in the range from approximately 100 MBit/s through 1 GBit/s were previously reserved for bipolar or gallium arsenide components in integrated circuits. However, as a result of progress in semiconductor technology, CMOS modules have also now reached this speed range. Terminating resistors are therefore also required at the inputs of CMOS modules for transmission of such high data rates.

Up to now, the terminating resistors of CMOS modules have been located outside the module on the printed circuit board close to the corresponding input pins. Modules of switching systems, for example switching network modules, or computer memories having address and data lines, have a large number of inputs so that substantial space is required for the corresponding terminating resistors. This reduces the packing density on the assembly. Additionally, there is a loss of performance when used with high frequency signals because the termination is not directly connected to the input stage of the receiver module. The housing of the module as well as electrostatic charge protection structure which are required still in CMOS modules are located between terminating resistor and input stage. When viewed electrically, the housing is essentially composed of line inductances and capacitances, such as pin and bond inductances and parasitic capacitors. Additionally there are coupling inductances and capacitances between the pins. The path from the external terminating resistor to the input stage can be viewed as a non-terminated line which results in reflections and consequently the transmission of high frequency signals is difficult. Terminating resistors in IC modules are known in the art, such as for example, Safferthal, "Terminieren von Signalleitungen", *Elektronik* 22/1990, pp. 236–254.

It is therefore desirable to terminate the line on the chip directly at the input stage. In standard CMOS technology, a sufficiently precise resistor layer is not currently available. Polysilicon or metal tracks and well resistors have manufacturing tolerances and temperature coefficients that are too high. These potentially lead to total variations of ±50% in the resistance value which is unacceptable. With such variations, undesired reflections and large fluctuations in the input levels (when the transmitter operates as current source, which is often the case) arise. A precision MOS resistor together with the corresponding drive circuit is disclosed, for example by GB-A-2 248 143.

SUMMARY OF THE PRESENT INVENTION

The object of the present invention is thus to provide the precise terminating resistor in CMOS technology. The present invention is directed to a CMOS terminating circuit wherein the terminating resistor is formed by a CMOS transmission gate that has its control electrodes connected to the control electrodes of an integrated reference transmission gate. The first control electrode of the integrated reference transmission gate is connected to the output of a first operational amplifier which is connected as a differential amplifier. The other control electrode is connected to the output of a second operational amplifier that follows the differential amplifier via its inverting input and is connected as an inverting amplifier with, desirably, the same resistance values for the drop and feedback resistor.

A series circuit is formed with a current mirror transistor supplied to a reference current source. The series circuit is at a terminating potential source parallel to a further series circuit formed by an external reference resistor (with a value of resistance corresponding to the desired terminating resistor value) and a further current mirror transistor. Two inputs of the differential amplifier are connected to the two inner junction points of the two series circuits. The transistors of the current mirror circuit can thereby desirably have the same channel lengths or, respectively, widths.

The invention provides the advantage of enabling precise, internal terminating resistors in CMOS technology and is thus able to eliminate the need for external terminating resistors. It reduces the required space and allows a higher density assembly. Additionally, the high-frequency characteristics are improved, so that higher bit rates are possible.

In a preferred embodiment of the invention, the input circuit of a comparator which is provided with a reference voltage source may also be connected in parallel to the current mirror transistor that is in series with the external reference resistor. The output is connected directly or, respectively, through an inverter to the control inputs of two CMOS transistors of opposite channel type. One of the CMOS transistors has its main electrodes lying between ground and the output line of the one differential amplifier and the other has its main electrodes between the voltage supply and the output line of the other differential amplifier. This makes it possible to flexibly change between internal and external termination, which can facilitate the signal distribution to a plurality of modules.

Further characteristics of the invention may be seen from the following description provided with reference to the drawings.

DESCRIPTION OF THE PRESENTLY PREFERRED EMBODIMENTS

Figure 1:
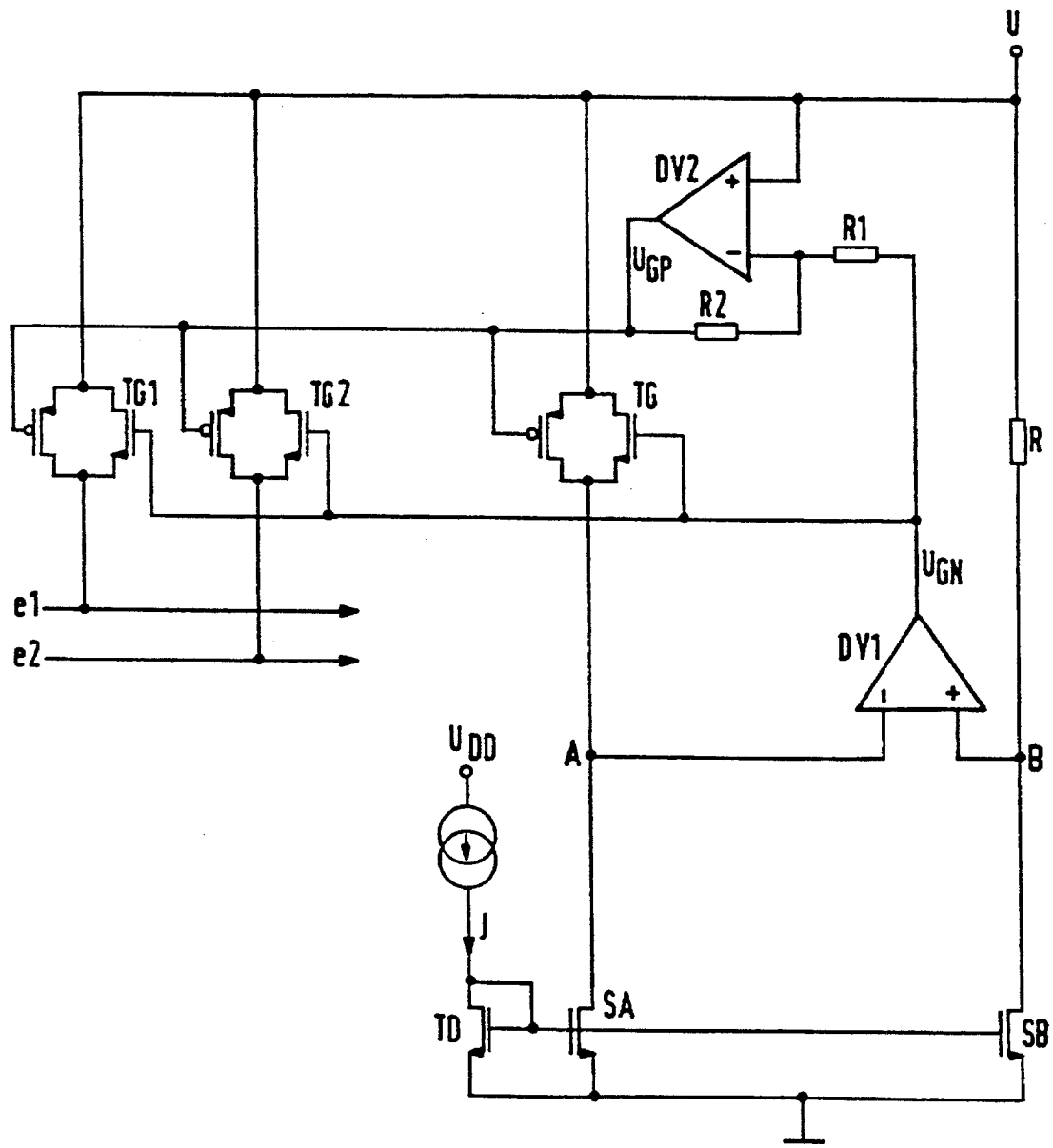
FIG. 1 is a schematic diagram of a first exemplary embodiment of a CMOS terminating resistor of the present invention.

In the CMOS terminating resistor circuit illustrated in FIG. 1, the terminating resistor is embodied as a transmission gate. A transmission gate is basically composed of a p-channel transistor and an n-channel transistor connected in parallel. The use of a transmission gate as a resistor is known in CMOS technology. The transistors are operated in the resistance region of their characteristics. The design exploits the fact that an MOS transistor behaves like a linear ohmic resistor between drain and source terminal for sufficiently low drain-source voltages. The value of resistance is dependent on the gate-source voltage and can thus be set. In order to set the transmission gate TG in FIG. 1, to a defined resistance of, for example 50 Ω, an external resistor R (outside the module) is used as a reference. The reference resistance value corresponds to the desired value of the terminating resistor. In conjunction with the current mirror transistor SA of current mirror circuit TD, SA, SB proceeding from a reference current source J, the transmission gate TG forms a series circuit TG-SA that is at a terminating potential source U. The potential source voltage corresponds to the desired terminating potential and the series circuit is parallel to a further series circuit R-SB formed by the external reference resistor R and a further current mirror transistor SB. One control electrode of the transmission gate TG is connected to the output of a first operational amplifier DV which operates as a differential amplifier. Its other control electrode is connected to the output of a second operational amplifier that follows the differential amplifier DV1 via its inverting input. This operational amplifier is connected as an inverting amplifier. The drop resistor R1 and feedback resistor R2 desirably have the same values of resistance so that the gain is equal to 1. As seen from FIG. 1, the two inputs of the differential amplifier DV1 are connected to the two internal junction points A,B of the two series circuits TG-SA, R-SB. The negative input is connected to the junction point A between transmission gate TG and current mirror transistor SA. The positive input is connected to the junction point B between reference resistor R and current mirror transistor SB. It is preferred that the transistors TD, SA, SB of the current mirror circuits each have the same channel lengths or, respectively, widths. The current flowing through the current mirror transistors SA and SB is then exactly the same size as the current flowing through the diode transistor TD i.e. the diode transistor TD mirrors the reference current J onto the current mirror transistors SA and SB. The generation of a reference current is known in the art, for example, Paul R. Gray, Robert G. Meyer, "Analysis and Design of Analog Integrated Circuits", John Wiley & Sons, New York, 1984 and thus is not set forth in greater detail here.

When identical currents flow through the current mirror transistors SA and SB, then identical currents also flow through the external reference resistor R and the internal transmission gate TG. The differential amplifier DV1 compares the voltages at points A and B and generates an output voltage $U_{GN}$ that controls the resistance of the n-channel transistor in the transmission gate via the corresponding control input of the transmission gate TG. The inverting amplifier DV2 similarly controls the resistance of the p-channel transistor in the transmission gate with its output voltage $U_{GP}$. The resistors R1 and R2 of the inverting amplifier DV2 can be realized as well resistors in CMOS technology since the only concern for setting the gain is the ratio of the resistance values and not the absolute values. The difference voltage $U_{GP}=2 \cdot U-U_{GN}$ arises as output voltage at the output of the inverting amplifier DV2. With reference to the terminating voltage U, gate-source voltages that are the same value but of opposite polarity are thus adjacent at the p-channel transistor and at the n-channel transistor of the transmission gate. The two transistors thus become more or less conductive in the same sense. When the potential at the circuit point B in the circuit arrangement of FIG. 1 is more positive than the voltage at the circuit point A, then the value of resistance of the transmission gate TG is higher than that of the reference resistor R since identical currents flow through the two. This causes the control voltage $U_{GN}$ to rise and the control voltage $U_{GP}$ drops, so that the transmission gate is driven farther open and, thus, its resistance is lowered, until the values of resistance of transmission gate TG and reference resistor R are the same and the circuit points A and B are at the same voltage level.

The resistance value of the internal resistor i.e. of the integrated transmission gate TG is automatically regulated to the value of the external resistor R. The control voltages $U_{GN}$ and $U_{GP}$ can then be used for controlling the actual terminating resistor value. As an example, FIG. 1 shows a differential input with two transmission gates TG1 and TG2 as termination of two input posts e1, e2. The transmission gates TG1 and TG2 are dimensioned just like the transmission gate TG and are placed close to it so that they are identical to the transmission gate TG and the same value of resistance is set by the control voltages $U_{GN}$ and $U_{GP}$.

In order to save dissipated power, the resistance value of the external resistor R can be increased, whereas the size of the current flowing therethrough is correspondingly reduced. When, for example, the resistor R has 10 times the value of the desired terminating resistance, then the value of the current flowing through the current mirror transistor SB is one-tenth the value of the reference current J in order to obtain the same potential at the junction points A and B. This can be easily realized at the current mirror in that the width of the current mirror transistor SB is dimensioned to be one-tenth the width of the current mirror transistor SA.

For certain applications with differential signal transmission, it is not necessary to respectively terminate input posts relative to a terminating potential U individually. A terminating resistance can be provided between the two input posts. This may be done, for example, in what is referred to as an SCI-LVDS interface (standardized by IEEE in the Draft Standard for SCI LVDS, low voltage differential signals, IEEE STANDARD P1596.3 dated Sep. 9, 1993, as outlined in FIG. 3. The transmission thus ensues differentially and the receiver input is terminated with a resistor $R_{AE}$ between the signal line leads a, b, whereby the value of the terminating resistance must be twice the value of the signal line characteristic impedance.

Figure 2:
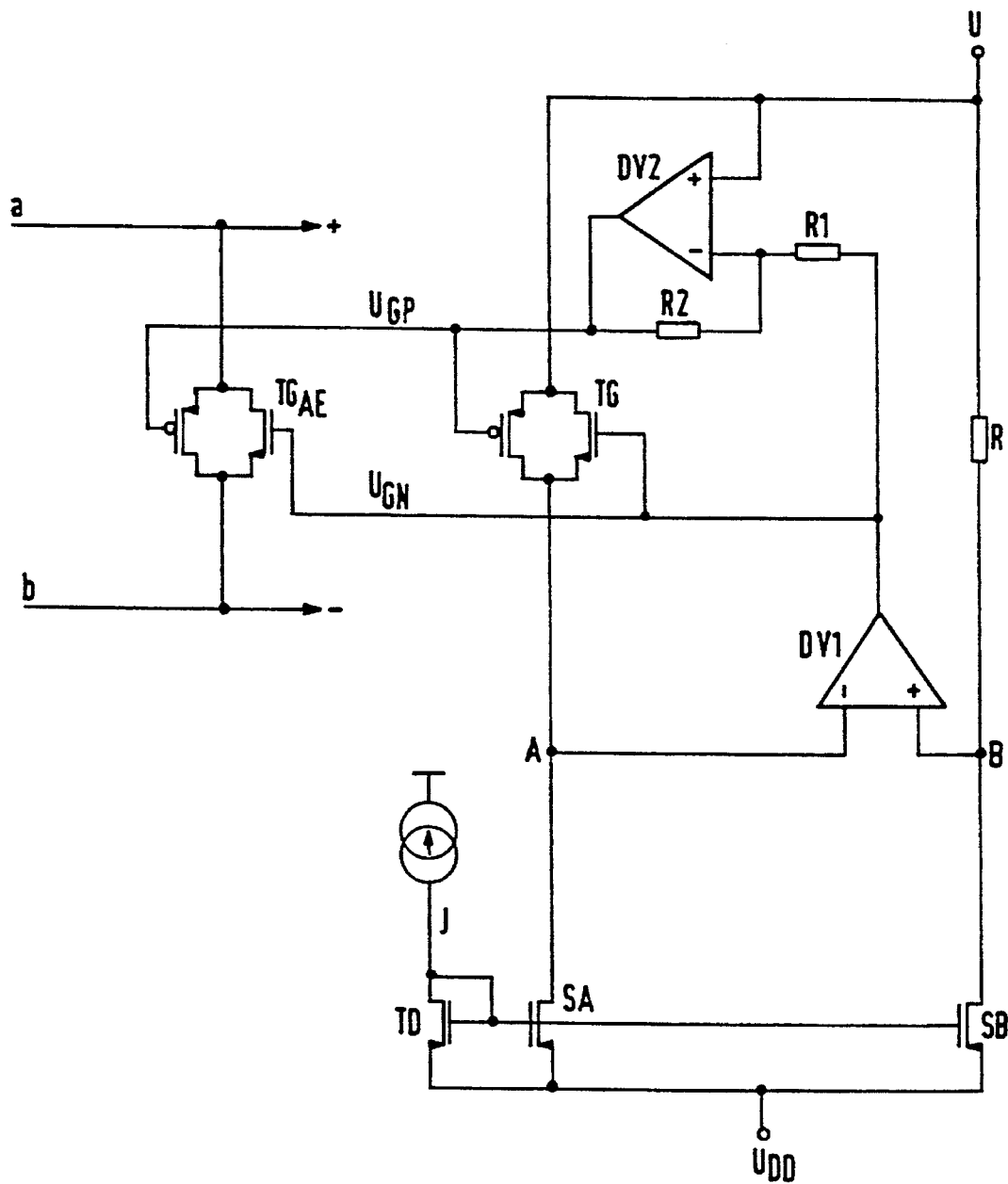
FIG. 2 is an alternate exemplary embodiment of a CMOS terminating resistor circuit of the present invention.

Such a floating terminating resistor ($R_{AE}$ in FIG. 3) can be realized with a transmission gate ($TG_{AE}$ in FIG. 2 that is set forth in greater detail below). This is controlled in the manner described in FIG. 1, by the output voltages $U_{GN}$ and $U_{GP}$ of differential amplifier DV1 and of inverting amplifier DV2 that follows. The differential amplifier DV1 has its one input at the junction point of the series circuit of reference transmission gate TG and a current mirror transistor SA. Its other input is at the junction point of the series circuit of reference resistor R and current mirror transistor SB.

An optimum setting for the value of the reference resistor R is achieved when the voltage U adjacent the series circuits TG-SA, R-SB is placed approximately in the middle between the high level and the low level of the input signal. When the D.C. portion of the input signal is unknown or is variable, the voltage U is desirably selected to be half of the supply voltage. The resistance value of the transmission gate at the input to be terminated can differ from that of the reference resistor R the more the more common mode part of the input signal differs from the value U. A compensation effect, however, results. When, for example, the common mode part approaches ground potential, the resistance of the p-channel transistor of the transmission gate rises. At the same time, the gate-source voltage of the n-channel transistor rises and, consequently, the resistance of the n-channel transistor drops. The increase in the resistance of the p-channel transistor is largely compensated in this manner. When the common mode part approaches the supply voltage $V_{DD}$, then the same compensation effect appears at the p-channel transistor.

Simulations have shown that good compensation is achieved in current 0.5 μ CMOS technology with 3.3 V supply voltage when the voltage U is approximately half the supply voltage. The common mode part at the input can fluctuate practically in the entire range of the supply voltage. An acceptable termination is still achieved by the described compensation effect even at the range limits.

In the SCI-LVDS interface, a middle level of 1.2 V (with reference to the ground potential of the transmitter) is defined between the high and low signal levels. A terminating voltage of 1.2 V would thus be desirable. Since the operating range for the circuit of FIG. 1, however, may then be somewhat tight, the terminating voltage U can be selected to be equal to half the supply voltage, as set forth above. It may be more desirable, however, to then realize the current mirror with p-channel transistors instead of with n-channel transistors and to tie it to the source of feed potential $U_{DD}$. The reference current source should then be turned around. The voltages are then referenced to $U_{DD}$, and a greater voltage range is available for the control circuit. Such a CMOS terminating resistor circuit for a floating terminating resistance $TG_{AE}$ is outlined in FIG. 2. The function of this terminating resistor circuit is basically the same as that of the terminating resistor circuit of FIG. 1, so that further explanation is not necessary.

Figure 3:
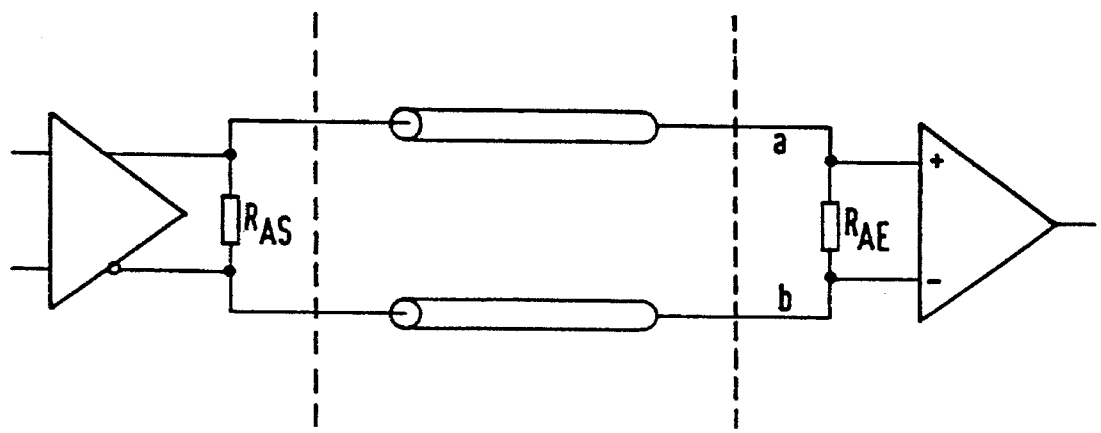
FIG. 3 illustrates operation of the resistor terminating circuit of the present invention.

The specification of the SCI-LVDS interface outlined in FIG. 3 also requires a specific internal resistance for the output of the transmitter module so that no reflections arise at the output even with returning waves potentially occurring due to asymmetries or disturbances. When the output stage of the transmitter operates as a current source that sends an impressed current onto the line, then the output is high-impedance and a terminating resistor $R_{AS}$ must also be integrated between the output lines. The controlled transmission gate set forth in FIG. 2 can also be used advantageously.

Figure 5:
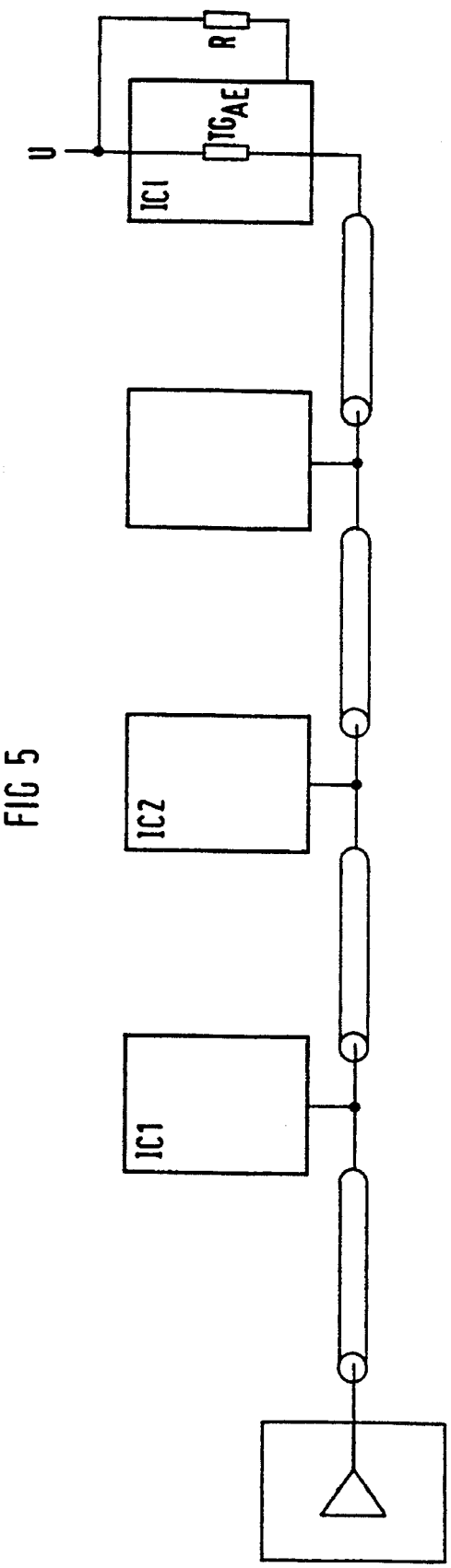
FIG. 5 illustrates operation of the resistor terminating circuit of the present invention.

Signals or clocks from a transmitter module are often to be transmitted particularly in the switching networks, of switching systems, not only to a single CMOS receiver module but to an entire series of CMOS receiver modules that are connected for that purpose to one and the same line carrying the signal or clock. In these circuits, the line is not terminated with a terminating resistor until the last module. Such a configuration is schematically shown in FIG. 5. The CMOS modules are referenced IC1, IC2, ..., etc. The line termination at the last module ICL can be effected with a CMOS terminating resistor circuit of the present invention, wherein the inputs of the remaining modules must be high-impedance.

Figure 4:
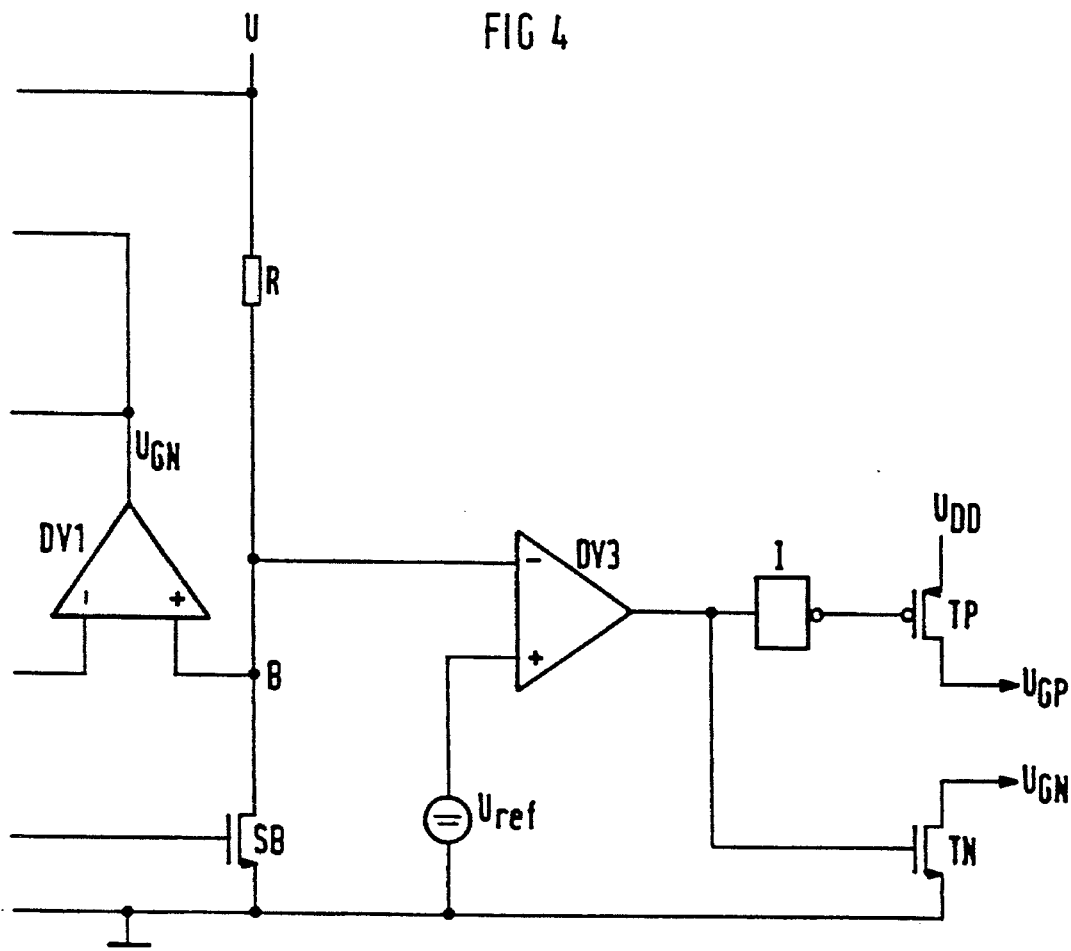
FIG. 4 is a schematic diagram of CMOS terminating resistor circuit of the present invention.

In order to have either a defined terminating resistor or an open circuit at the module input and in order to have the possibility of using uniform CMOS modules, the input circuit of a comparator DV3 provided with a reference voltage source $U_{ref}$ can, be connected parallel to the current mirror transistor SB which is in series with the external reference resistor R as outlined in FIG. 4. In the individual terminating resistor circuits in a refined version of the present invention, the output of the comparator DV3 is directly connected or, alternately, via inverter I to the control inputs of two MOS transistors of opposite channel type. The one having its main electrodes between ground and the output line of the one differential amplifier DV1. The other having its main electrodes between the supply voltage source $U_{DD}$ and the output line of the other differential amplifier DV2. In FIG. 4, the external resistor R, the current mirror transistor SB and the first differential amplifier DV1 of the remaining terminating resistor circuit are also shown at the left. As shown in FIG. 4, an additional differential amplifier is provided as comparator DV3, its non-inverting input being connected to the reference voltage source $U_{ref}$. The reference voltage must be lower than the voltage at the node B in regulating mode. The output of the comparator is then low, i.e. approximately ground potential, and the n-channel transistor TN and the p-channel transistor TP following via the inverter 1 are non-conductive and thus have no influence via the control voltage lines $U_{GN}$, $U_{GP}$ (in FIG. 4 and FIG. 1 ) on the regulation of the terminating resistor value. The reference voltage, can be derived from the supply voltage by voltage division through well resistors.

In an alternate embodiment, different from that illustrated in FIG. 4, the external reference resistor R is omitted (R→∞), then the current mirror transistor SB pulls the node B to ground potential. The output of the comparator DV3 switches to the high condition, and the two transistors TN and TP become conductive. As a result of the dimensioning, the two transistors TN and TP should be stronger than the output transistors of the two differential amplifiers DV1 and DV2. The output line $U_{GN}$ thus goes to ground potential and the output line $U_{GP}$ goes to the feed potential $U_{DD}$, with the result that the transmission gates (TG in the control circuit and TG1, TG2 (or, respectively, $TG_{AE}$) at the inputs) assume high values of resistance. The internal terminating resistors are thus deactivated.

In the example of FIG. 5, the external reference resistor (R in FIG. 4) is omitted at all of the CMOS modules IC1, .... except for the last one. This external reference resistor is provided only at the last CMOS module ICl, with the result that the line leading to the CMOS modules IC1, ..., ICI is properly terminated exactly at its end by the CMOS module ICI.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

I claim as my invention:

1. A CMOS termination circuit comprising:

a CMOS transmission gate having first and second control electrodes, the transmission gate control electrodes connected to corresponding first and second control electrodes of an internal reference transmission gate;

the first control electrode of the internal reference transmission gate connected to an output of a differential amplifier;

the second control electrode of the internal reference transmission gate connected to an output of an inverting amplifier;

the output of the differential amplifier connected to an inverting input of the inverting amplifier;

the internal reference transmission gate connected in series with a first current mirror transistor of a current mirror circuit which is connected to a reference current source;

an external reference resistor connected in series with a second current mirror transistor of the current mirror circuit;

a first input of the differential amplifier connected to a connection point between the internal reference transmission gate and the first current mirror transistor;

a second input of the differential amplifier connected to a connection point between the external reference resistor and the second current mirror transistor.

2. The CMOS termination circuit of claim 1, wherein a resistance value of the external reference resistor is equal to a value of a desired terminating resistor.

3. The CMOS termination circuit of claim 1, wherein a channel length or, respectively, width of the first current mirror transistor is the same as a channel length or, respectively, width of the second current mirror transistor.

4. The CMOS termination circuit of claim 1, wherein a channel length or, respectively, width of the first current mirror transistor is different to a channel length or, respectively, width of the second current mirror transistor.

5. The CMOS termination circuit of claim 1, wherein a resistance value of the drop resistor of the inverting amplifier is the same as a value of a feedback resistor of the inverting amplifier.

6. The CMOS termination circuit of claim 1, further comprising:

a reference voltage source connected to a first input of a comparator;

a second input of the comparator connected to the connection point between the external reference resistor and a second current mirror; and an output of the comparator connected to a control input of a pair of CMOS transistors of first and second channel types.

7. A CMOS termination circuit comprising:

a CMOS transmission gate having first and second control electrodes, the transmission gate control electrodes connected to corresponding first and second control electrodes of an internal reference transmission gate;

the first control electrode of the internal reference transmission gate connected to an output of a differential amplifier;

the second control electrode of the internal reference transmission gate connected to an output of an inverting amplifier;

the output of the differential amplifier connected to an inverting input of the inverting amplifier;

the internal reference transmission gate connected in series with a first current mirror transistor of a current mirror circuit which is connected to a reference current source;

an external reference resistor connected in series with a second current mirror transistor of the current mirror circuit;

a first input of the differential amplifier connected to a connection point between the internal reference transmission gate and the first current mirror transistor;

a second input of the differential amplifier connected to a connection point between the external reference resistor and the second current mirror transistor;

a reference voltage source connected to a first input of a comparator;

a second input of the comparator connected to the connection point between the external reference resistor and a second current mirror; and an output of the comparator connected to a control input of a pair of CMOS transistors of first and second channel types.

8. The CMOS termination circuit of claim 7, wherein a resistance value of the external reference resistor is equal to a value of a desired terminating resistor.

9. The CMOS termination circuit of claim 7, wherein a channel length of the first current mirror transistor is the same as a channel length of the second current mirror transistor.

10. The CMOS termination circuit of claim 7, wherein a channel width of the first current mirror transistor is different than a channel width of the second current mirror transistor.

11. The CMOS termination circuit of claim 7, wherein a resistance value of the drop resistor of the inverting amplifier is the same as a value of a feedback resistor of the inverting amplifier.

* * * * *